(12) United States Patent
Aizawa et al.

(10) Patent No.: US 7,898,160 B2
(45) Date of Patent: Mar. 1, 2011

(54) METHOD AND APPARATUS FOR MODIFYING OBJECT WITH ELECTRONS GENERATED FROM COLD CATHODE ELECTRON EMITTER

(75) Inventors: Koichi Aizawa, Neyagawa (JP); Tsutomu Ichihara, Hirakata (JP); Takuya Komoda, Sanda (JP); Jyunji Ikeda, Toyonaka (JP); Toru Baba, Osaka (JP)

(73) Assignee: Panasonic Electric Works Co., Ltd., Kadoma-shi (JP)

( * ) Notice: Subject to any disclaimer, the term of this patent is extended or adjusted under 35 U.S.C. 154(b) by 803 days.

(21) Appl. No.: 10/572,748

(22) PCT Filed: Nov. 25, 2004

(86) PCT No.: PCT/JP2004/017969
§ 371 (c)(1),
(2), (4) Date: Mar. 21, 2006

(87) PCT Pub. No.: WO2005/052978
PCT Pub. Date: Jun. 9, 2005

(65) Prior Publication Data
US 2006/0290291 A1    Dec. 28, 2006

(30) Foreign Application Priority Data

Nov. 25, 2003  (JP) ................... 2003-394653
Nov. 25, 2003  (JP) ................... 2003-394655
Apr. 23, 2004  (JP) ................... 2004-128824
Apr. 23, 2004  (JP) ................... 2004-128856

(51) Int. Cl.
*H01J 9/02*    (2006.01)

(52) U.S. Cl. .................. 313/309; 313/336; 315/169.3
(58) Field of Classification Search .................. 313/309, 313/495, 558, 496, 351, 336, 481, 422; 315/169.3
See application file for complete search history.

(56) References Cited

U.S. PATENT DOCUMENTS

| 4,305,000 | A | 12/1981 | Cheever |
| 5,136,212 | A | 8/1992 | Eguchi et al. |
| 5,445,798 | A | 8/1995 | Ikeda et al. |

(Continued)

FOREIGN PATENT DOCUMENTS

EP    0 639 401 A1    2/1995

(Continued)

OTHER PUBLICATIONS

Japanese Notification of Reasons for Refusal, Nov. 4, 2008, issued in JP2003-394655.

(Continued)

*Primary Examiner* — David Hung Vu
(74) *Attorney, Agent, or Firm* — Edwards Angell Palmer & Dodge LLP (57) ABSTRACT

Apparatus and method for modifying an object with electrons are provided, by which the object can be uniformly and efficiently modified with the electrons under a pressure substantially equal to atmospheric pressure even when having a relatively wide surface area to be treated. This method uses a cold-cathode electron emitter having the capability of emitting electrons from a planar electron emitting portion according to tunnel effect, and preferably comprising a pair of electrodes, and a strong field drift layer including nanocrystalline silicon disposed between the electrodes. The object is exposed to electrons emitted from the planar electron emitting portion by applying a voltage between the electrodes.

17 Claims, 8 Drawing Sheets

U.S. PATENT DOCUMENTS

| | | | |
|---|---|---|---|
| 5,608,197 A | 3/1997 | Palmer | |
| 6,236,156 B1 * | 5/2001 | Ito | 313/495 |
| 6,285,118 B1 * | 9/2001 | Hatai et al. | 313/310 |
| 6,345,497 B1 | 2/2002 | Penetrante | |
| 2003/0197457 A1 | 10/2003 | Komoda et al. | |

FOREIGN PATENT DOCUMENTS

| | | |
|---|---|---|
| EP | 0 989 577 A2 | 3/2000 |
| JP | 1-209643 | 8/1989 |
| JP | 3-29662 | 2/1991 |
| JP | 05-137946 | 6/1993 |
| JP | 7-115946 | 5/1995 |
| JP | 08-020126 | 1/1996 |
| JP | 09-166700 | 6/1997 |
| JP | 09-192209 | 7/1997 |
| JP | 11-231100 | 8/1999 |
| JP | 2000-69908 | 3/2000 |
| JP | 2000-100316 | 4/2000 |
| JP | 2000-208293 | 7/2000 |
| JP | 2001-273850 A | 10/2001 |
| JP | 2002-6094 | 1/2002 |
| JP | 2002-022899 | 1/2002 |
| JP | 2002-049226 | 2/2002 |
| JP | 2002-279887 | 9/2002 |
| JP | 2002-318300 | 10/2002 |
| JP | 2002-333499 | 11/2002 |
| JP | 2003-172800 | 6/2003 |
| JP | 2004-027153 | 1/2004 |
| JP | 2004-031145 | 1/2004 |

OTHER PUBLICATIONS

Japanese Notification of Reasons for Refusal dated Feb. 3, 2009 issued in JP2004-128823.

Notification of Reasons for Refusal dated Oct. 4, 2007, issued in JP2003-394654.

Notification for Reasons for Refusal dated Apr. 15, 2009, issued in JP2003-394655.

Japanese Office Action dated Oct. 6, 2009 issued in Japanese Patent Application No. 2004-128856.

Japanese Notification of Reasons for Refusal dated Feb. 16, 2010 issued in JP2004-128823.

Office Action issued May 18, 2010 in the corresponding Japanese Patent Application.

* cited by examiner

METHOD AND APPARATUS FOR MODIFYING OBJECT WITH ELECTRONS GENERATED FROM COLD CATHODE ELECTRON EMITTER

FIELD OF THE INVENTION

The present invention relates to method and apparatus for modifying an object with electrons.

DESCRIPTION OF THE RELATED ART

In the past, electron irradiation has been utilized to surface modify, sterilize or clean an object. For example, Japanese Patent Early Publication [kokai] No. 2002-6094 discloses an electron irradiating apparatus that can be used to form a cross-bridge structure or purify exhaust gas. This apparatus is provided with an electron gun having a hot filament, a high-voltage power source for supplying an electric current to the hot filament to generate electrons, an accelerating electrode for accelerating the generated electrons to obtain an electron beam, and an electromagnet for deflecting the electron beam.

However, because the hot filament is an electron source having a spot-like or linear electron emitting portion, it is necessary to scan the electron beam to modify a relatively wide surface area of the object. This leads to a reduction in treatment efficiency, and a complication in device structure. In addition, because the hot filament is heated under a high degree of vacuum to generate the electrons, vacuum equipment such as a decompression chamber and a vacuum pump are needed. As a result, there is a problem that the application area of the apparatus is narrow despite an increase in cost of the apparatus.

On the other hand, Japanese Patent Early Publication No. 3-29662 discloses a method of sterilizing animal feeding stuff by irradiation of a high energy electron beam of 5 to 10 MeV. In addition, Japanese Patent Early Publication No. 2000-69908 discloses a method of sterilizing green tea powder by irradiation of an electron bean of 200 keV to 300 keV. In these methods, since an expensive electron accelerator is needed to obtain the high energy electron beam, a considerable increase in cost of the apparatus becomes a problem. In addition, it has been difficult to irradiate such a high electron beam to a wide surface area of the object at a time.

SUMMARY OF THE INVENTION

In view of the above-mentioned problems, a concern of the present invention is to provide a method of efficiently and uniformly modifying an object with electrons even when the object has a relatively wide surface area to be modified.

That is, the method of the present invention comprises the steps of providing a cold-cathode electron emitter, which has the capability of emitting electrons from a planar electron emitting portion according to tunnel effect, applying a voltage to the emitter to emit the electrons from the planar electron emitting portion, and exposing the object to the emitted electrons. As the cold-cathode electron emitter, it is particularly preferable to use a Ballistic electron Surface-emitting Device (BSD) comprising a pair of electrodes, and a strong field drift layer including nanocrystalline silicon disposed between the electrodes.

According to the present invention, because the cold cathode electron emitter that is a planar-type electron emitting source is used, it is possible to perform the modifying treatment to the object under a reduced pressure near atmospheric pressure in addition to the improvement in treatment efficiency and uniformity. In particular, when using the BSD as the cold cathode electron emitter, it is possible to perform the modifying treatment under atmospheric pressure without using vacuum equipments such as a vacuum pump and decompression chamber. Therefore, there are many advantages of an expansion of the application area, downsizing of the apparatus, and a reduction in cost of the modifying treatment.

In the present invention, the meaning of the word "modify" or "modifying" includes various types of reactions such as hardening, polymerization, decomposition, bridging, oxidizing, ionization, excitation and radical reaction, changing surface tension, surface energy, wettability, adhesion, absorption index, refractive index or crystal structure, introduction of defects, sterilization, disinfection, filtration of virus, mold, pollen and so on, physiological actions such as germination, ageing or prevention maturation, propagation of good bacteria, deodorizing, cleaning, purifying, and removal of harmful substances.

In the above method, it is preferable that an energy of the electrons used to modify the object is selected from a range of 1 eV to 50 keV, and preferably 1~100 eV.

A further concern of the present invention is to provide an apparatus for efficiently and uniformly modifying an object with electrons. That is, this apparatus comprises a cold-cathode electron emitter, which has the capability of emitting electrons from a planar electron emitting portion according to tunnel effect, voltage applying unit for applying a voltage to the emitter to emit the electrons from the planar electron emitting portion, and a case for accommodating the emitter therein. The case has an opening, through which the electrons or a gas activated by the electrons are provided. From the same reason as the above, it is particularly preferable to use a Ballistic electron Surface-emitting Device (BSD) as the cold-cathode electron emitter, which comprises a pair of first and second electrodes, and a strong field drift layer including nanocrystalline silicon disposed between the first and second electrodes.

In addition, it is preferable that the above apparatus further comprises an accelerating electrode positioned in face-to-face relation with the planar electron emitting portion to accelerate the electrons. In this case, it is possible to control the energy of electrons irradiated to the object.

In the above apparatus, it is preferable that the first electrode is composed of an array of first electrode strips, which are arranged to be spaced from each other in a lateral direction, and the second electrode is composed of an array of second electrode strips, which are arranged to be spaced from each other in a direction intersecting with the lateral direction, wherein the electrons are selectively emitted from the planar electron emitting portion corresponding to an intersecting region(s) between at least one of the first electrode strips and at least one of the second electrode strips when the voltage is applied therebetween by the voltage applying unit. Furthermore, it is preferable that the apparatus has a first selector for selecting at least one of the first electrode strips, and a second selector for selecting at least one of the second electrode strips, wherein the voltage applying unit applies the voltage between at least one of the first electrode strips selected by the first selector and at least one of the second electrode strips selected by the second selector to selectively emit the electrons from the planar electron emitting portion corresponding to the intersecting region(s) therebetween. In this case, it is possible to change a modification area depending on the size of the object, thereby achieving energy saving and reducing the modification cost.

Another concern of the present invention is to provide an apparatus for performing the modifying method described above. This apparatus comprises a cold-cathode electron emitter, which has the capability of emitting electrons from a planar electron emitting portion according to tunnel effect, voltage applying unit for applying a voltage to the emitter to emit the electrons from the planar electron emitting portion, and a holder for supporting the object such that the object is exposed to the emitted electrons. From the same reason as the above, it is particularly preferred to use the BSD as the cold-cathode electron emitter.

These and still other objects and advantages of the present invention will become more apparent from the best mode for carrying out the invention, referring to the attached drawings.

DETAILED DESCRIPTION OF EXEMPLARY EMBODIMENTS

The present invention is explained below in detail according to preferred embodiments.

First Embodiment

Figure 1:
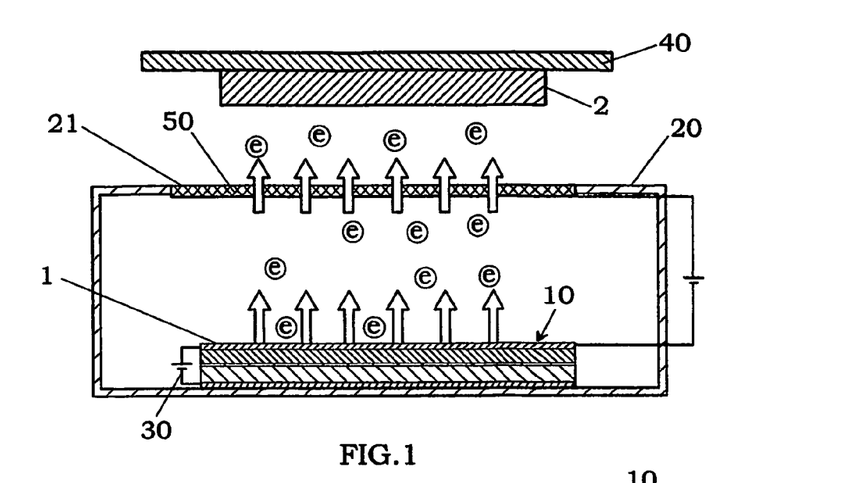
FIG. 1 is a schematic cross-sectional view of an apparatus for modifying an object with electrons according to a first embodiment of the present invention.
Figure 2:
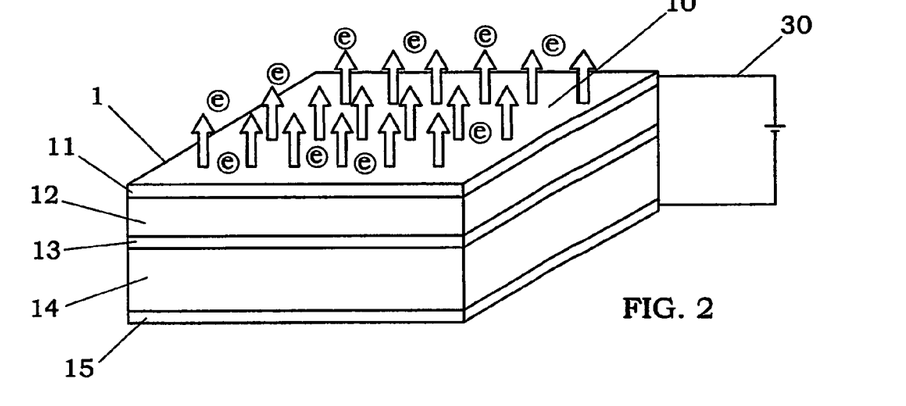
FIG. 2 is a schematic perspective view of a cold cathode electron emitter of the apparatus.

As shown in FIGS. 1 and 2, an apparatus for modifying an object 2 with electrons according to the present embodiment comprises a cold cathode electron emitter 1 having a planar electron emitting portion 10, a voltage applying unit 30 for applying a voltage to the emitter to emit electrons from the planar electron emitting portion, a case 20 for accommodating the emitter therein, which is made of an insulating material and has an opening 21 used to permit the emitted electrons to travel to the outside of the case, and a holder 40 for supporting the object 2 such that the object is exposed to the electrons provided through the opening. In FIG. 1, the numeral 50 designates a mesh electrode attached to the opening 21 to accelerate the electrons generated from the emitter 1. Alternatively, a window member made of a material, through which the electrons can pass, may be attached to the opening in place of the accelerating electrode.

As shown in FIG. 2, the cold cathode electron emitter 1 comprises a conductive substrate 14 such as n-type silicon, a non-doped polycrystalline silicon layer 13 formed on a top surface of the conductive substrate 14, strong-field drift layer 12 formed on the polycrystalline silicon layer 13, a first electrode 11 provided on the strong-field drift layer 12, and an ohmic electrode 15 formed on the bottom surface of the conductive substrate 14. In this case, the conductive substrate 14 and the ohmic electrode 15 function as a second electrode. In addition, a top surface of the first electrode 11 provides the planar electron emitting portion 10 of the emitter 1. The strong-field drift layer 12 may be directly formed on the conductive substrate not through the polycrystalline silicon layer 13. Alternatively, another cold cathode electron emitter 1 shown in FIG. 3 may be used, in which an insulating substrate 16 such as glass or a ceramic material is used in place of the conductive substrate 14, an electrode layer 17 is formed as the second electrode on the insulating substrate, and the strong-field drift layer 12 is formed on the electrode layer 17. The cold cathode electron emitter 1 used in this embodiment is known as "Ballistic electron Surface-emitting Device" (BSD).

Figure 4:
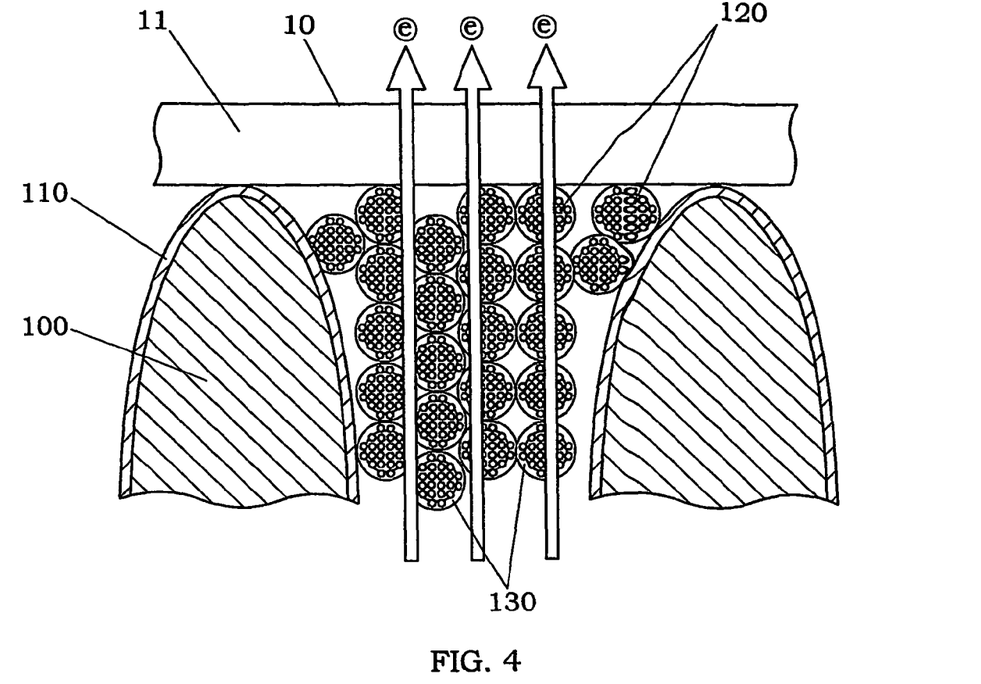
FIG. 4 is an explanatory view of a strong-field drift layer of the cold cathode electron emitter.

As shown in FIG. 4, the strong field drift layer 12 is composed of columnar polycrystalline silicon grains 100 extending toward the first electrode 11, first silicon oxide thin films 110 formed in surfaces of the silicon grains 100, fine grains of nanocrystalline silicon 120 formed between the adjacent silicon grains 110, and second silicon oxide thin films 130 formed in surfaces of the fine grains 120, each of which has a smaller thickness than a crystal grain size of the nanocrystalline silicon.

For example, the strong field drift layer 12 can be produced according to the following procedures. Firstly, a nanocrystallization process is performed to a non-doped polycrystalline silicon layer on a conductive substrate, thereby obtaining a nanocrystalline composite layer having the columnar polycrystalline silicon grains 100 and the fine grains of nanocrystalline silicon 120. In the nanocrystallization process, for example, an electrolytic solution obtained by mixing a 55 wt % hydrofluoric aqueous solution with ethanol at a mixing ratio of 1:1 is used.

Then, the conductive substrate having an electrode layer used as the ohmic electrode and the polycrystalline silicon layer is placed in the electrolytic solution. The electrode layer is used as anode electrode, and a platinum electrode positioned on the polycrystalline silicon layer is used as cathode electrode. By supplying a constant electric current having a current density of 12 mA/cm$^2$ between the anode and cathode electrodes for a predetermined time period, e.g., 10 seconds, while irradiating light from a 500 W tungsten lamp, the nanocrystalline composite layer can be obtained. In the nanocrystalline composite layer, amorphous silicon may be formed at regions other than the silicon grains 100 and the fine grains of nanocrystalline silicon 120. Alternatively, depending on the condition of the nanocrystalline process, the amorphous silicon regions may be formed by fine pores. In this case, the nanocrystalline composite layer has a porous structure.

Next, an oxidizing process is performed to the nanocrystalline composite layer to obtain the strong field drift layer 12. In this oxidizing process, for example, an electrolytic solution obtained by adding 0.04 mol/l of potassium nitrate into an organic solvent such as ethyleneglycol is used. Then, the conductive substrate having the nanocrystalline composite layer is placed in the electrolytic solution. The electrode layer used as the ohmic electrode is the anode electrode, and a platinum electrode positioned on the nanocrystalline composite layer is used as cathode electrode. By supplying a constant electric current having a current density of 0.1 mA/cm$^2$ between the anode and cathode electrodes for a time period needed for a voltage increase of 20 V therebetween, the nanocrystalline composite layer can be electrochemically oxidized to obtain the strong field drift layer 12.

In the strong field drift layer 12, amorphous silicon or a partially-oxidized amorphous silicon may be formed at regions other than the silicon grains 100, the fine grains of nanocrystalline silicon 120, the first and second silicon oxide thin films (110, 130). When forming these silicon oxide thin films (110, 130), a nitriding process or an oxynitriding process may be performed in place of the oxidizing process described above. In the case of the nitriding process, those silicon oxide thin films are replaced by silicon nitride thin films. In the case of the oxynitriding process, those silicon oxide thin films are replaced by silicon oxynitride thin films.

To emit electrons from the cold cathode electron emitter 1, when a required voltage is applied between the first electrode 11 and the ohmic electrode 15 such that an electric potential of the first electrode is higher than the electric potential of the ohmic electrode, electrons are injected from the second electrode into the strong field drift layer 12. At this time, because most of the electric field is impressed to the first and second silicon oxide thin films (110, 130) of the strong field drift layer 12, the injected electrons are accelerated by the strong electric field impressed to those silicon oxide thin films, so that the electrons are drifted in regions between the silicon grains 100 of the strong field drift layer 12, as shown by the arrows in FIG. 4, and emitted outside through the first electrode 11 without being almost scattered by the fine grains of nanocrystalline silicon 120. This phenomenon is called a "Ballistic electron Surface-emitting phenomenon" that is a kind of the tunnel effect. Because heat generated from the strong field drift layer 12 is released through the silicon grains 100, it is possible to avoid the occurrence of popping at the time of the electron emission.

Electrons emitted from the cold cathode electron emitter 1 are called "cold electrons". On the contrary, electrons generated from a spot-like or linear electron emitter such as hot filament by heating are called "thermal electrons". In addition, the cold cathode electron emitter 1 used in the present invention is known as a field-emission type electron source that is preferably used for display devices, for example, as disclosed in Japanese Patent Early Publication No. 2000-100316.

The electrons provided from the cold cathode electron emitter 1 through the opening 21 of the case 20 are irradiated to a surface to be modified of the object 2 supported by the holder 40. An energy of the electrons irradiated can be determined according to the purpose of the modifying treatment. For example, to avoid radio activation of the object, it is preferred to use an energy level of less than 10 MeV, and, more preferably, less than 1 MeV. In the case of using an energy level smaller than 300 keV, a radiological protection equipment for X-ray can be simplified.

To achieve desired modifying effects that meet the purpose of the present invention, it is preferred to use electrons having an energy selected from a range of 1 to 50 keV, and, more particularly, 1 to 100 eV. When irradiating the electrons having an energy of approximately 4 eV, atoms and molecules can be excited. In addition, when irradiating electrons having an energy of 4 to 12 eV, which is equal to or slightly larger than 4 to 8 eV of the bonding energy between atoms, the object can be effectively surface modified. When irradiating electrons having an energy of 20 to 100 eV, atoms and molecules can be ionized. Furthermore, when irradiating electrons having an energy smaller than the ionization energy to a gas containing moisture or steam as the object, the electrons are attached to the object, so that minus ions can be readily generated.

By the way, there is an advantage that the energy level of the electrons emitted from the cold cathode electron emitter is higher in proportion to a magnitude of the voltage applied between the electrodes. For example, electrons having an energy of 1 eV to several ten electron volts can be obtained by use of 10 to 20 V of the applied voltage, which is much higher than the electron level, e.g., 0.1 eV, of the thermal electrons generated from the hot filament.

Figure 5:
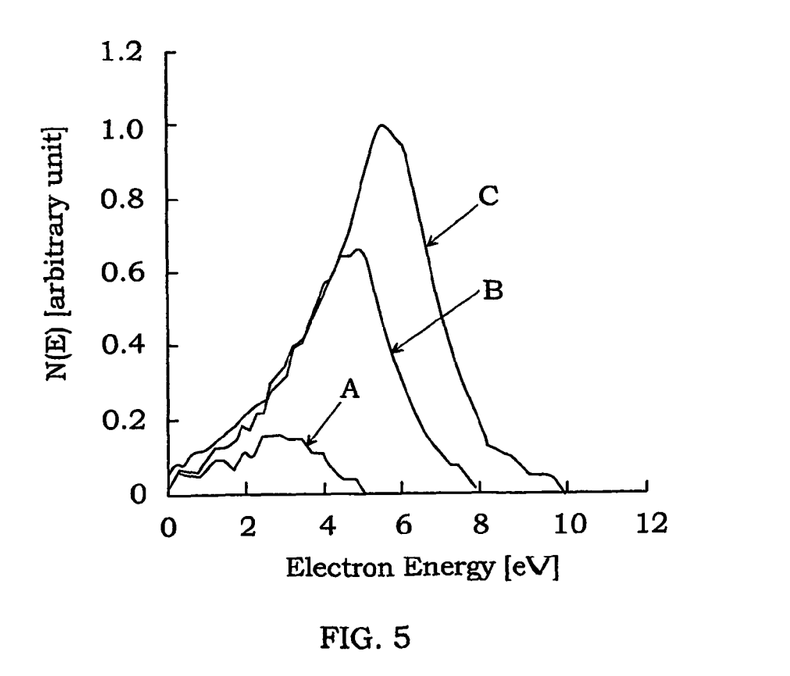
FIG. 5 is a graph showing energy distributions of electrons emitted from the cold cathode electron emitter.

As an example, energy distributions of electrons emitted from the cold cathode electron emitter 1 are shown in FIG. 5. In this figure, "A", "B" and "C" designate profiles showing the energy distributions obtained when the voltages of 12 V, 14V and 16V are respectively applied between the electrodes. These profiles show that as the applied voltage increases, the peak becomes sharper, and the peak position is shifted to the high energy side.

In the case of controlling the energy of the electrons emitted from the cold cathode electron emitter 1, it is preferred to dispose an accelerating electrode 50 above the first electrode 11 in the vicinity of the opening 21 of the case 20, and apply a required voltage between the accelerating electrode and the first electrode such that an electric potential of the accelerating electrode is higher than the electric potential of the first electrode. For example, as shown in FIG. 3, when a voltage Vps is applied between the first and second electrodes (11, 17) of the cold cathode electron emitter 1, and an acceleration voltage Vc is applied between the accelerating electrode (anode electrode) 50 and the first electrode 11 such that the electric potential of the accelerating electrode is higher than the electric potential of the first electrode, it is possible to control the energy of the emitted electrons depending on a magnitude of the acceleration voltage Vc.

Figure 3:
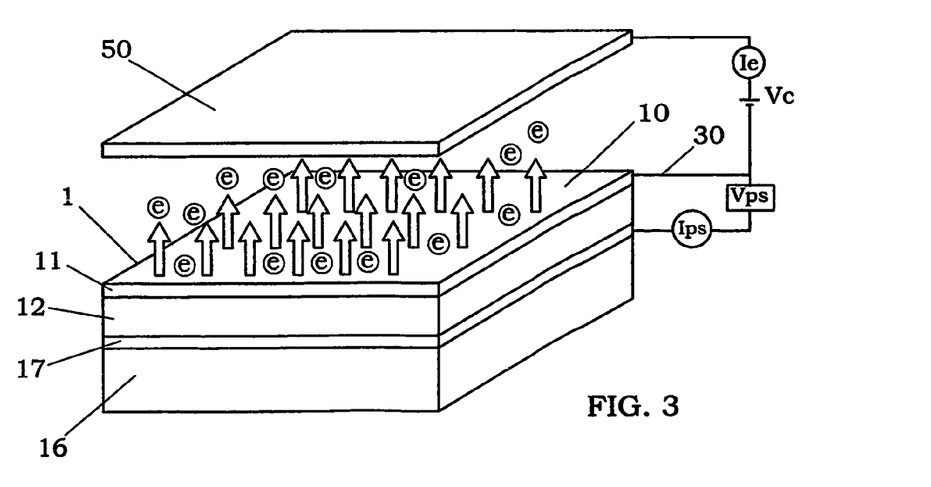
FIG. 3 is a schematic perspective view of another cold cathode electron emitter.

In FIG. 3, when an electric current flowing between the first and second electrodes (11, 17) is represented as a diode current Ips, and an electric current flowing between the accelerating electrode 50 and the first electrode 11 is represented as an emission current Ie, an electron emissivity can be defined as a rate of the emission current Ie to the diode current Ips (=Ie/Ips). As this ratio is larger, the electron emissivity increases. According to the present invention, even when a relatively low voltage of 10 to 20 V is applied as the voltage Vps between the first and second electrodes (11, 17), it is possible to emit electrons. In addition, because the dependence of the electron emissivity on degree of vacuum is small, and popping does not happen at the time of electron emission, it is possible to stably emit the electrons at an improved electron emissivity. This means that electrons can be emitted at a pressure in the vicinity of atmospheric pressure. As the voltage Vps, a constant DC voltage or a pulse voltage can be used. In the case of using the pulse voltage, a reverse-bias voltage may be applied when the voltage Vps is not applied. Similarly, as the acceleration voltage Vc, a constant DC voltage or a pulse voltage can be used.

The accelerating electrode 50 can be made of a metal material such as aluminum, tungsten and stainless steel. In addition, the accelerating electrode 50 may be configured in a frame shape to fit the opening 21 of the case 20. In this case, the electrons are irradiated to the object through an inner space of the frame shape of the accelerating electrode. Alternatively, a grid electrode may be disposed in the vicinity of the opening of the case.

In conclusion, the modifying apparatus and method of this embodiment presents the following effects.

(1) Because the cold cathode electron emitter having a planar electron emitting portion is used, it is possible to uniformly irradiate electrons to a wide surface area of the object at a time, as compared with the case of using an electron emitting source having a spot-like or linear electron emitting portion such as hot filament. As a result, improved modification efficiency and uniformity can be achieved.

(2) The cold cathode electron emitter such as BSD has a capability of emitting electrons under atmospheric pressure. Therefore, it is possible to perform the modifying treatment without using vacuum equipments such as decompression chamber and vacuum pump.

(3) The cold cathode electron emitter can be driven by a pulse voltage because a rise time needed to emit the electrons is shorter than the electron emitting source for emitting thermal electrons such as hot filament. Therefore, there is an advantage of reducing power consumption.

(4) Because no device for scanning the electron beam is needed in the present invention, a further reduction in cost of the apparatus can be achieved.

Figure 6:
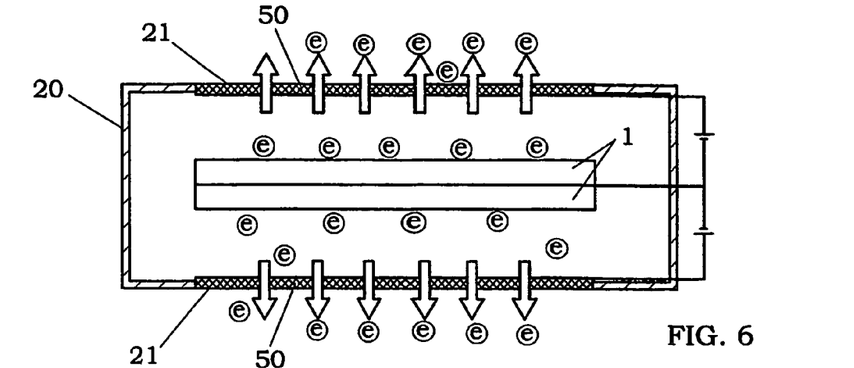
FIG. 6 is a schematic cross-sectional view of an apparatus according to a modification of the first embodiment.
Figure 7A:
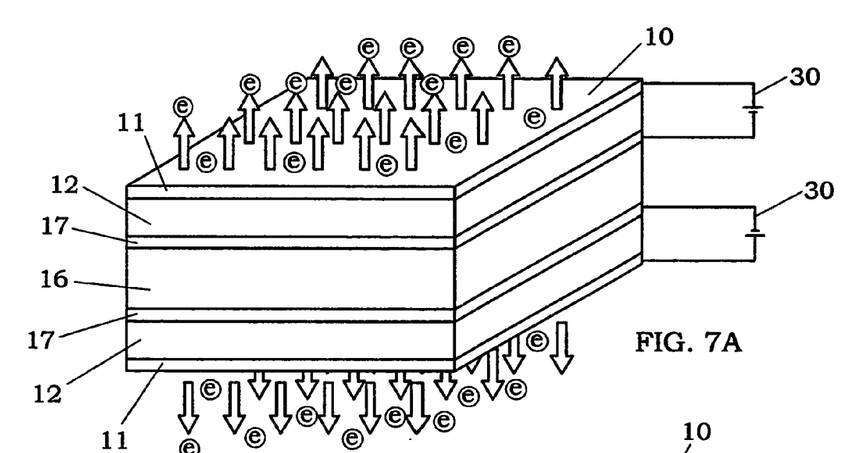
FIGS. 7A and 7B are schematic perspective views of preferred arrangements of cold cathode electron emitters.
Figure 7B:
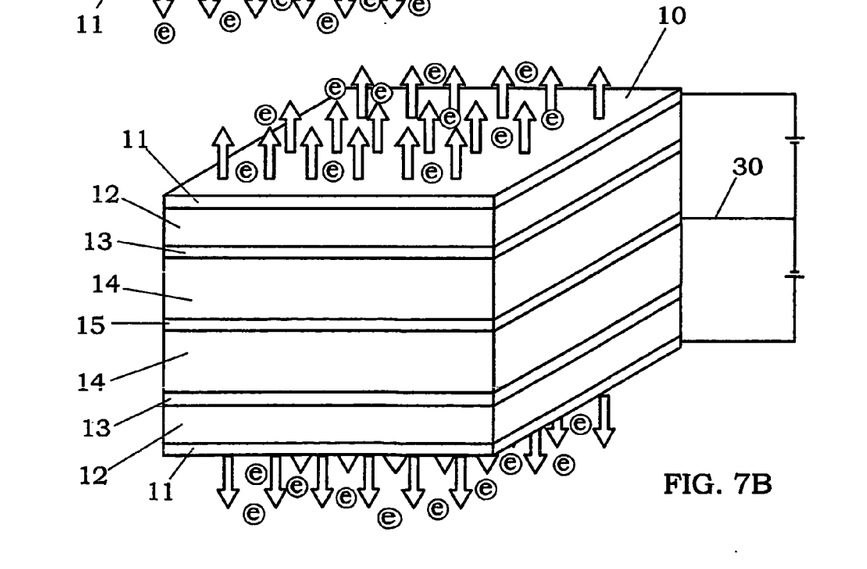

As a modification of this embodiment, as shown in FIG. 6, it is preferable that a pair of cold-cathode electron emitters 1, each of which is the cold-cathode electron emitter explained above, are disposed such that electrons are emitted in opposite directions through a pair of openings 21 formed in the case 20. In this case, the second electrodes 17 of the pair of cold-cathode electron emitters are respectively connected to opposite surfaces of the insulating substrate 16, as shown in FIG. 7A Alternatively, it is preferable that the ohmic electrodes 15 of the pair of cold-cathode electron emitters are composed of a common electrode disposed between strong field drift layers 12, as shown in FIG. 7B. In this case, electrons are emitted in opposite directions by applying a voltage between the common electrode 15 and the first electrodes 11 of the cold-cathode electron emitters. Therefore, it is possible to simplify the voltage applying unit by reducing the number of electrodes.

Figure 8:
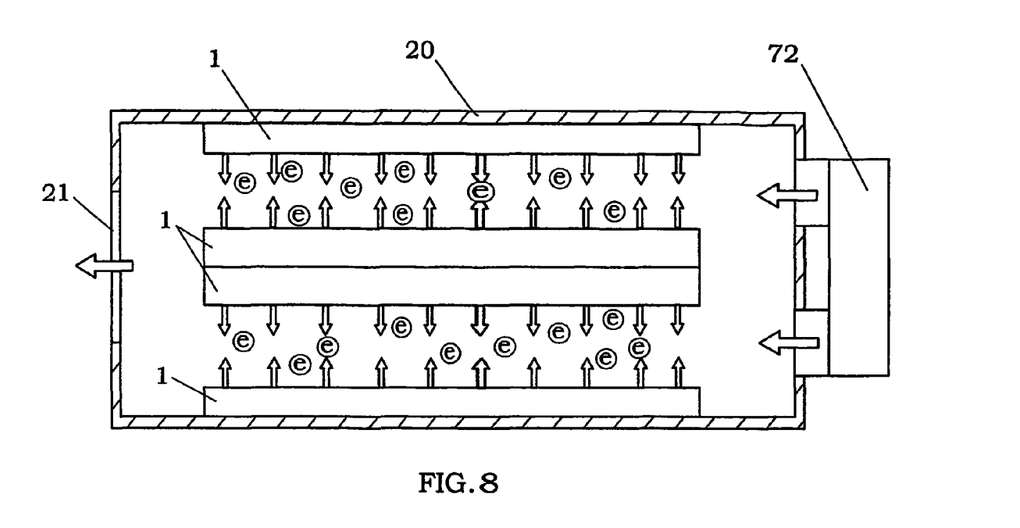
FIG. 8 is a schematic cross-sectional view of an apparatus according to a further modification of the first embodiment.

In addition, by forming a two or three dimensional array of at least one cold cathode electron emitter having the capability of simultaneously emitting the electrons in opposite directions, as shown in FIG. 7A or 7B, and at least one cold cathode electron emitter having the capability of emitting the electrons in one direction, as shown in FIG. 2 or 3, it is possible to design a high-efficiency modifying apparatus for simultaneously irradiating electrons to the object from different directions. For example, a modifying apparatus shown in FIG. 8 has a pair of treatment spaces, in each of which electrons can be simultaneously irradiated from the opposite two directions. In FIG. 8, the numeral 72 designates a gas supply unit for supplying a gas as the object into the case. Therefore, the gas activated by the electrons in the treatment spaces is ejected outside through the opening 21 of the case 20.

Figure 9:
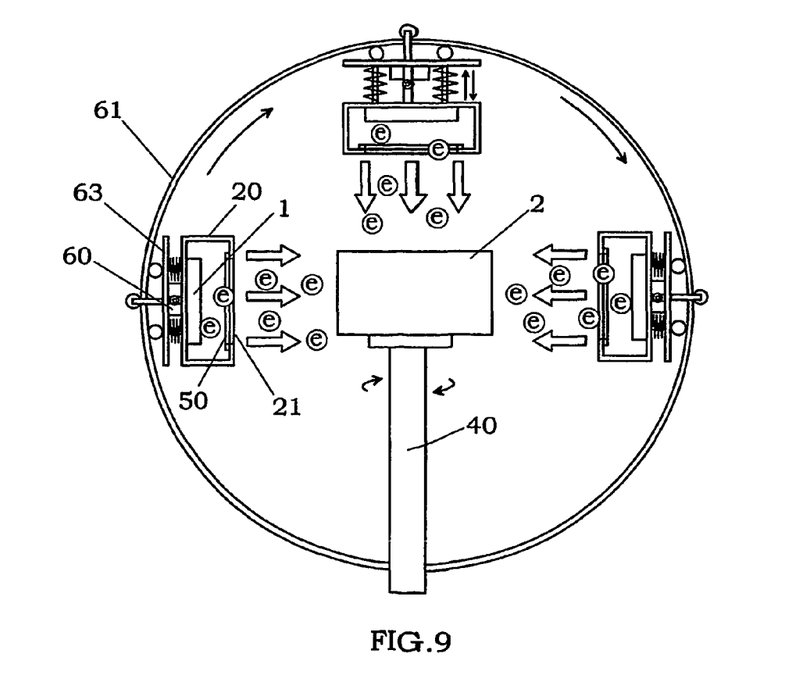
FIG. 9 is a schematic cross-sectional view of an apparatus according to another modification of the first embodiment.

A modifying apparatus according to a modification of this embodiment is shown in FIG. 9. This apparatus comprises a holder 40 for supporting the object 2, and an emitter traveling unit 60 for traveling the case 20 with the cold cathode electron emitter 1 therein around the object. As the emitter traveling unit, for example, it is preferable that a rail 61 is formed along a desired trajectory, and a carrier 63 for the case 20 is traveled along the rail. In this case, it is possible to selectively irradiate the electrons to a desired surface area of the object, without moving the object, and to also change the irradiation angle of the electrons to the object.

The emitter traveling unit 60 may further comprise a distance adjuster for moving the case 20 upward or downward against the carrier 63 to adjust the distance between the cold cathode electron emitter 1 and the object 2. In addition the holder 40 may be rotatable around the holder axis, if necessary. When it is needed to perform the modifying treatment in a desired gas atmosphere, it is preferable that the above-described modifying apparatus is accommodated in a chamber with a gas supply unit for charging the gas into the chamber. In the present invention, because the modifying treatment can be performed under atmospheric pressure, the structure of the chamber can be simplified as compared with the case of forming a decompression chamber. The emitter traveling unit 60 and the gas supply unit can be controlled by use of an operation panel provided outside of the chamber.

Second Embodiment

In this embodiment, an apparatus and method for modifying a gas as the object by irradiation of electrons are explained.

Figure 10:
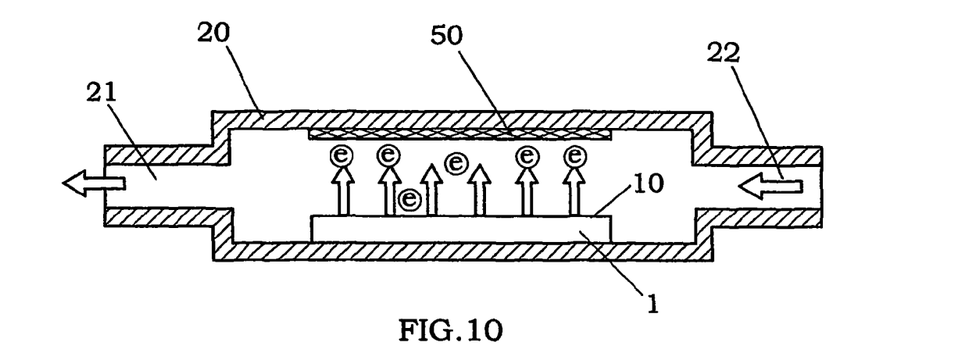
FIG. 10 is a schematic cross-sectional view of an apparatus for modifying an object with electrons according to a second embodiment of the present invention.

As shown in FIG. 10, the modifying apparatus of this embodiment comprises a case 20 having a gas inlet 22 for supplying the object gas into the case, and an opening 21 for providing a modified gas to the outside, and an acceleration electrode (anode electrode) 50 disposed in a face-to-face manner with an electron emitting portion 10 of a cold cathode electron emitter 1 in the case. The cold cathode electron emitter is the same as the emitter used in the first embodiment. Therefore, duplicate explanation is omitted. To avoid the influence of humidity on electron emitting efficiency of the cold cathode electron emitter, it is preferable that the gas supplied in the case 20 through the gas inlet 22 is a dry gas having a low moisture content. For example, it is preferable that the relative humidity (RH %) is smaller than 30%, and more preferably 10%. In this case, electrons emitted from the cold cathode electron emitter 1 are accelerated toward the acceleration electrode 50, and irradiated to the gas existing in a space between the cold cathode electron emitter and the acceleration electrode to ionize the gas. As a result, the ionized gas is provided outside through the opening 21.

For example, negative ions can be readily generated by supplying the dry gas containing an element having positive electron affinity or a large electron affinity such as oxygen in the case 20 through the gas inlet 21. In this case, it is preferable to apply an acceleration voltage Vc of several volts to several ten volts between the acceleration electrode 50 and the first electrode 11. The generated negative ions provided through the opening 21 are bonded with molecules in the outside air to generate various sorts of ions. On the other hand, when a voltage of several ten volts to several mega volts, which is larger than the ionization energy (for example, several ten electron volts) of the dry gas, is applied between the acceleration electrode 50 and the first electrode 11, positive ions can be generated.

Figure 11:
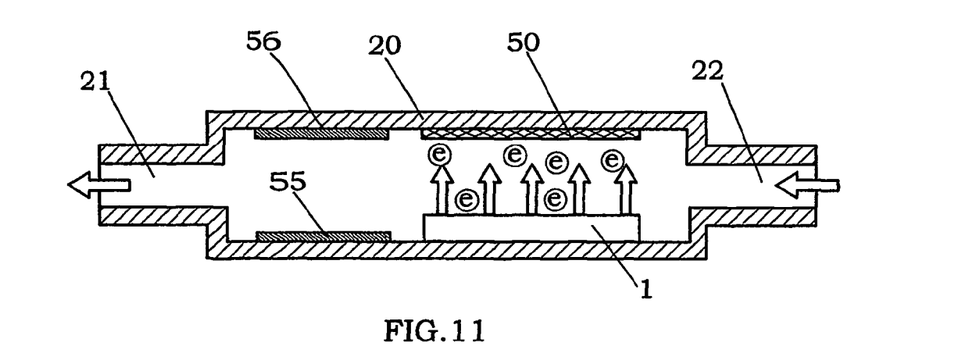
FIG. 11 is a schematic cross-sectional view of an apparatus according to a first modification of the second embodiment.

It is also preferable that an auxiliary electrode (not shown) is placed outside of the case 20 in front of the opening 21 to control the amounts of ions ejected therefrom. In the case of ejecting the negative ions from the opening 21, it is preferable that an electric potential of the auxiliary electrode is determined to be higher than the electric potential of the first electrode 11 of the cold cathode electron emitter 1. In addition, as shown in FIG. 11, a pair of auxiliary electrodes (55, 56) may be disposed in the case 20 such that one of the auxiliary electrodes 55 is positioned adjacent to the cold cathode electron emitter 1 and at the side of the opening 21, and the other auxiliary electrode 56 is positioned adjacent to the acceleration electrode 50 at the side of the opening. In this case, it is preferred that an electric potential of the auxiliary electrodes (55, 56) is determined to be higher than the first electrode 11 of the cold cathode electron emitter 1 to eject the negative ions from the opening 21.

The structure of the auxiliary electrode is not specifically limited. For example, the auxiliary electrode may comprise a mesh electrode, grid electrode, electrode obtained by concentrically arranging ring-like electrode members having different diameters, and an electrode obtained by arranging a plurality of linear electrode members in parallel with each other. In addition, the modifying apparatus may comprise a spray unit for spraying a second gas containing liquid particles such as medical constituents or steam to the ions ejected through the opening 21 of the case 20. In this case, the second gas can be ionized by the ions provided from the case.

Figure 12:
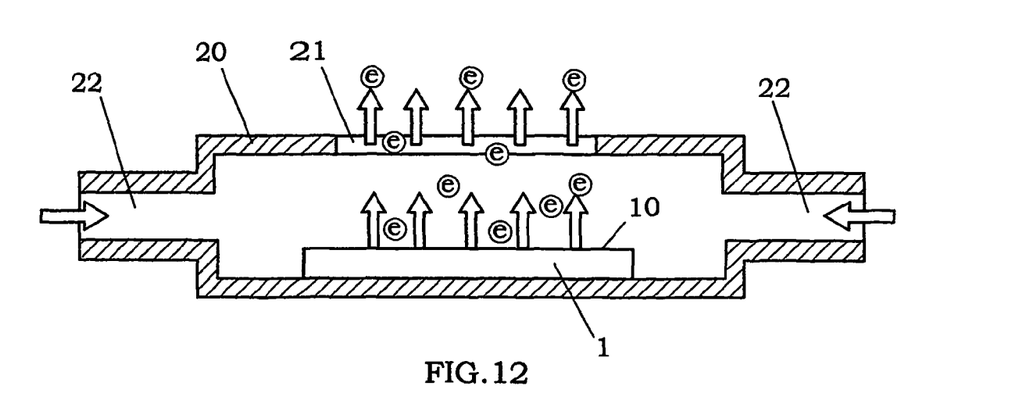
FIG. 12 is a schematic cross-sectional view of an apparatus according to a second modification of the second embodiment.

A modifying apparatus according to a modification of this embodiment is shown in FIG. 12. This apparatus is characterized by using a case 20 having air inlets 22 for supplying a low moisture gas such as dried air, oxygen or an inert gas in the case, which are formed in opposite side walls of the case, and an opening 21 for ejecting the electrons emitted from the cold cathode electron emitter 1 and the gas modified by the electrons, which is formed in a top wall of the case 20 and above the electron emitting portion 10 of the cold cathode electron emitter 1.

Figure 13:
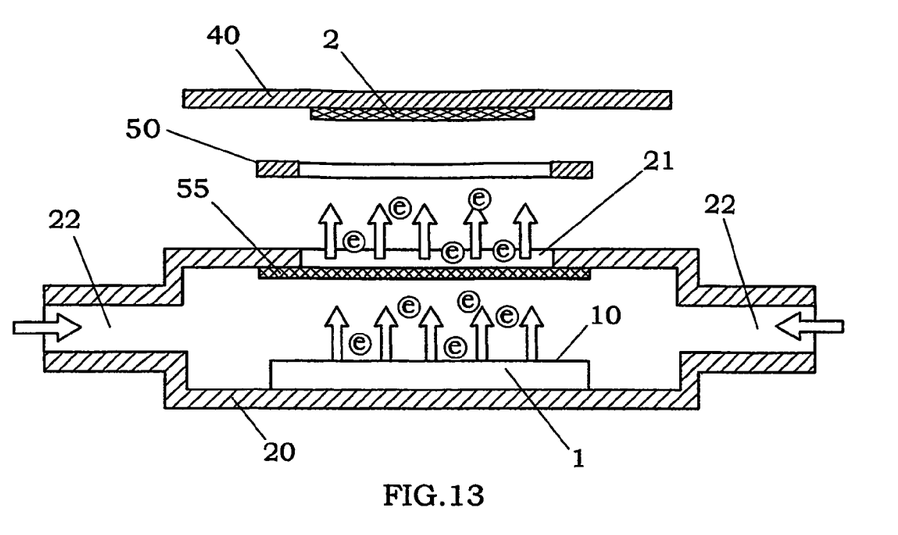
FIG. 13 is a schematic cross-sectional view of an apparatus according to a third modification of the second embodiment.

To control the energy of the electrons ejected from the opening 21, as shown in FIG. 13, an acceleration electrode (anode electrode) 50 having a ring shape can be disposed above the opening of the case 20. If necessary, an auxiliary electrode 55 such as mesh electrode may be attached to an inner surface of the top wall of the case 20 around the opening 21. In this case, it is preferred that an electric potential of the auxiliary electrode 55 is determined to be higher than the electric potential of the first electrode 11 of the cold cathode electron emitter 1, and the electric potential of the accelerating electrode 50 is determined to be higher than the electric potential of the auxiliary electrode 55. The electrons emitted from the cold cathode electron emitter 1 are accelerated by the accelerating electrode 50 and the auxiliary electrode 55, and then irradiated to the object 2 supported by the holder 40 through a center opening of the accelerating electrode.

Figure 14:
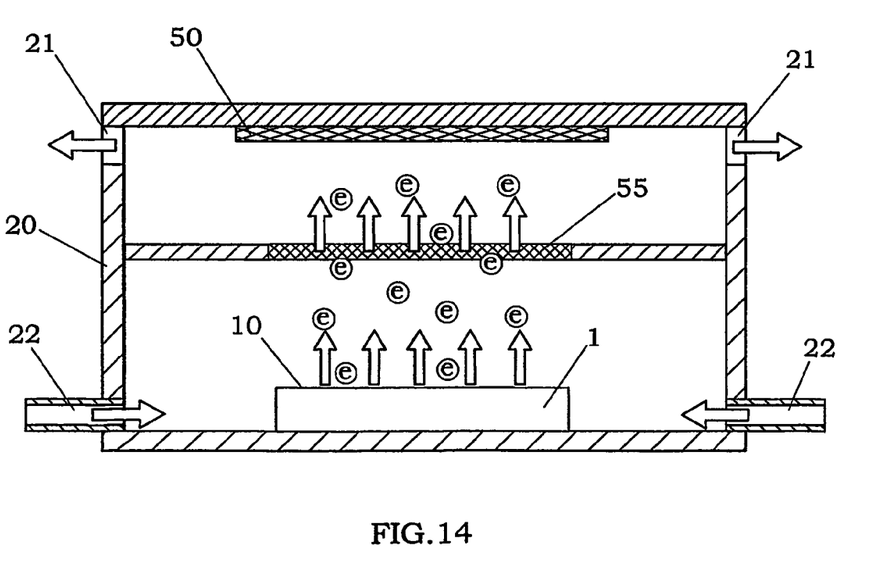
FIG. 14 is a schematic cross-sectional view of an apparatus according to a fourth modification of the second embodiment.

Alternatively, the auxiliary electrode 55, e.g., mesh electrode may be disposed between the electron emitting portion 10 of the cold cathode electron emitter 1 and the accelerating electrode 50 attached to an inner surface of the top wall of the case 20, as shown in FIG. 14. In this case, a gas supplied from gas inlets 22 in the case 20 is modified by electrons emitted from the cold cathode electron emitter 1, and then the modified gas is ejected outside from a pair of openings 21 formed in upper portions of opposite side walls of the case 20.

Third Embodiment

In this embodiment, a modifying apparatus and method for irradiating electrons to a gas or a gas containing liquid particles such as steam or moisture are explained.

Figure 15:
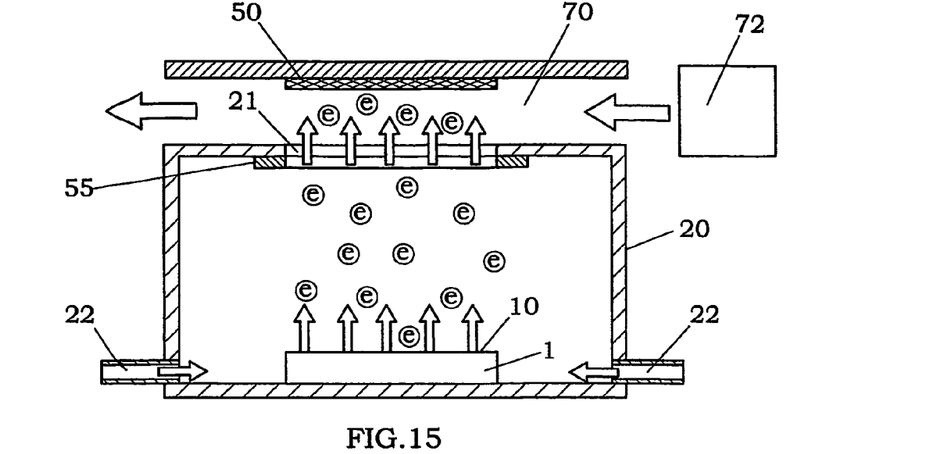
FIG. 15 is a schematic cross-sectional view of an apparatus for modifying a gas object with electrons according to a third embodiment of the present invention.

That is, as shown in FIG. 15, this modifying apparatus uses a case 20 comprising gas inlets 22 for supplying a gas into the case, which are formed in lower portions of side walls of the case, and an opening 21 for ejecting electrons emitted from the cold cathode electron emitter 1, which is formed in a top wall at a position facing the electron emitting portion 10 of the cold cathode electron emitter placed on a bottom wall of the case. In addition, this apparatus has an accelerating electrode 50 disposed above the opening, and a gas flow channel 70 provided on the top wall of the case 20. In this case, the gas is supplied as the object to the gas flow channel 70 from a gas supply unit 72, as shown by the horizontal arrow in FIG. 15, and then modified by the electrons accelerated from the cold cathode electron emitter 1 toward the acceleration electrode 50 through the opening 21. In addition, an auxiliary electrode 55 configured in a ring shape is attached to the inner surface of the top wall of the case around the opening 21. It is preferable that an electric potential of the auxiliary electrode 55 is determined to be higher than the electric potential of the first electrode 11 of the cold cathode electron emitter 1, and an electric potential of the accelerating electrode 50 is determined to be higher than the electric potential of the auxiliary electrode 55.

In this embodiment, it is preferable that the gas supplied in the case 20 through the gas inlet 22 is a gas composed of atoms or molecules having a smaller electron affinity than oxygen. For example, such a gas comprises helium, argon, xenon, and nitrogen. In this case, the electron emitted from the cold cathode electron emitter 1 can be efficiently provided to the gas flowing in the gas flow channel 70. In other words, when the air is charged in the case 20, the number of electrons having a sufficient energy for achieving the purpose of the modifying treatment may decrease, or variations in energy distribution of the electrons may increase because of interference of the electrons emitted from the cold cathode electron emitter with atoms and molecules in the air. As a result, when the air is charged in the case, it is preferred that the gas flow channel 70 is spaced from the electron emitting portion 10 of the cold cathode electron emitter 1 by a distance of 5 mm to 1 cm to perform the modifying treatment.

On the other hand, when the gas having a smaller electron affinity than oxygen is charged in the case 20, the gas flow channel 70 can be spaced from the electron emitting portion 10 by a larger distance of several cm to several ten cm. As a result, this leads to an improvement in modifying efficiency and a higher degree of freedom of designing the apparatus. In addition, it is possible to prevent contamination of the cold cathode electron emitter 1, and prolong the maintenance cycle. The gas supplied into the gas flow channel 70 may contain medical constituents as the liquid particles.

Figure 16:
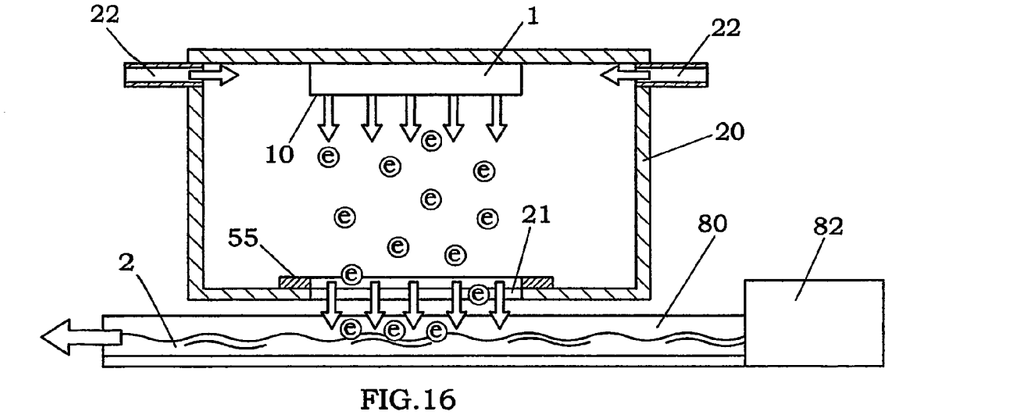
FIG. 16 is a schematic cross-sectional view of an apparatus for modifying a liquid object according to a modification of the third embodiment.
Figure 17:
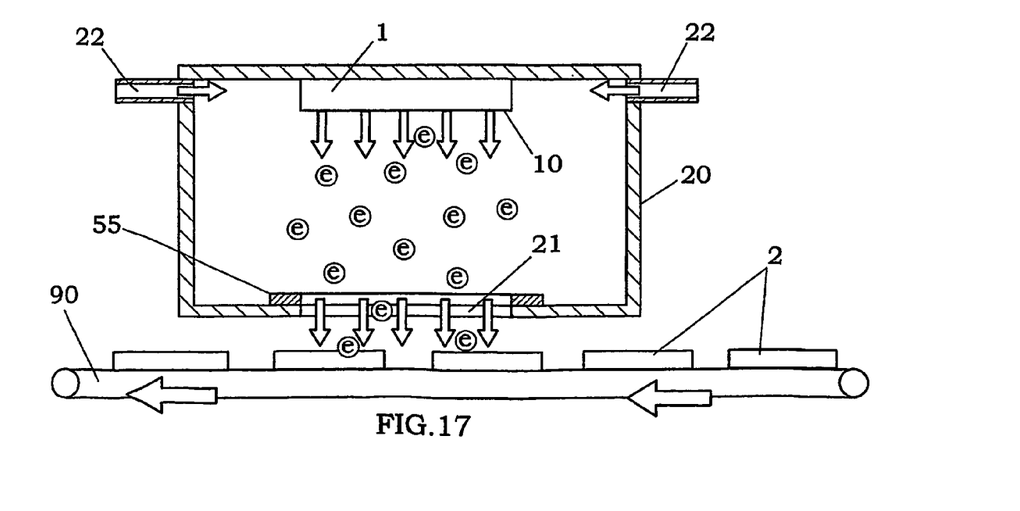
FIG. 17 is a schematic cross-sectional view of an apparatus for modifying a sold object according to a further modification of the third embodiment.

As a modification of this embodiment, in the case of irradiating electrons to a liquid as the object, it is preferable that the cold cathode electron emitter 1 is disposed on the inner surface of the top wall of the case 20, and electrons emitted downwardly from the cold cathode electron emitter are irradiated to the liquid through the opening 21 formed in the bottom wall of the case, as shown in FIG. 16. In FIG. 16, the numeral 80 designates a liquid flow channel disposed under the case 20. The liquid is supplied to the liquid flow channel 80 by a liquid supply unit 82. In addition, by replacing the liquid flow channel 80 with a conveyer 90 such as a belt conveyer, as shown in FIG. 17, it is possible to successively modify solid objects on the conveyer 90 by the irradiation of electrons.

Fourth Embodiment

Figure 18A:
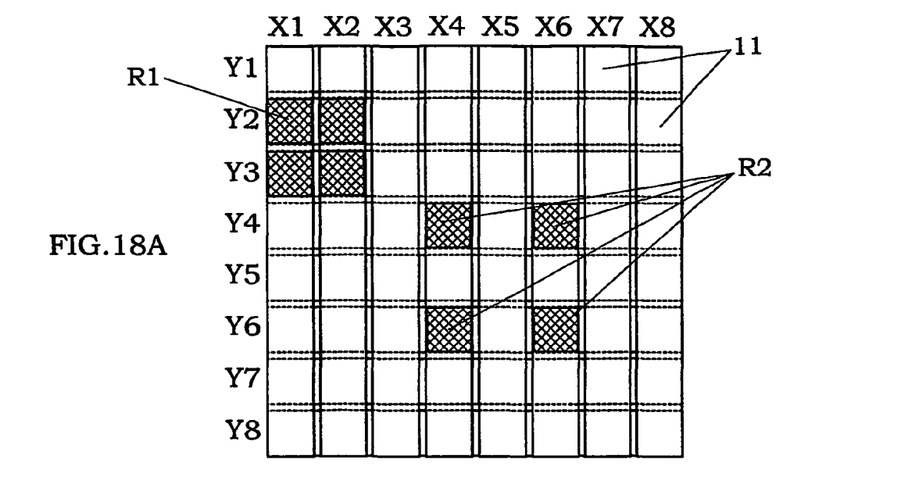
FIGS. 18A and 18B are top and cross-sectional views of an apparatus for modifying an object with electrons according to a fourth embodiment of the present invention.
Figure 18B:
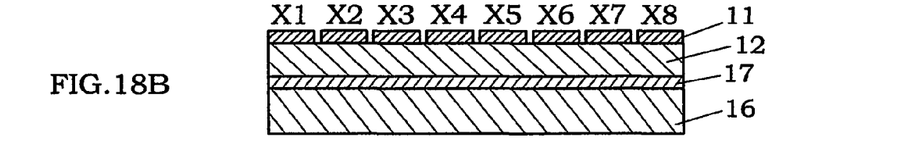

In this embodiment, a modifying apparatus having the capability of changing an electron irradiation area depending on the size of the object is explained. That is, as shown in FIGS. 18A and 18B, the first electrode 11 of the cold cathode electron emitter 1 is composed of an array of first electrode strips X1 to X8, which are arranged to be spaced from each other in a lateral direction. On the other hand, the second electrode 17 of the cold cathode electron emitter is composed of an array of second electrode strips Y1 to Y8, which are arranged to be spaced from each other in a direction intersecting with said lateral direction. Therefore, the strong field drift layer 12 is disposed between the array of first electrode strips X1 to X8 and the array of second electrode strips Y1 to Y8.

In this case, when the voltage is applied between at least one of the first electrode strips X1 to X8 and at least one of the second electrode strips Y1 to Y8 by the voltage applying unit, the electrons are selectively emitted from an intersecting region(s) therebetween. For example, as shown in FIG. 18A, when the voltage is applied between the first electrode strips X1, X2 and the second electrode strips Y2, Y3, electrons are emitted from the intersecting region R1. In addition, when the voltage is applied between the first electrode strips X4, X6 and the second electrode strips Y4, Y6, electrons are emitted from plural intersecting regions R2. Thus, the modifying apparatus of this embodiment is suitable to efficiently perform the modifying treatment to the object having regions, which the irradiation of electrons is not needed. In addition, there is an advantage of saving power consumption.

To readily change the electron irradiation area, it is preferable that the modifying apparatus further comprises a first selector for selecting at least one of the first electrode strips X1 to X8, and a second selector for selecting at least one of the second electrode strips Y1 to Y8, and a controller for controlling the voltage applying unit in response to outputs of the first and second selectors. In this case, the controller controls the voltage applying unit such that the voltage is applied between at least one of the first electrode strips X1 to X8 selected by the first selector and at least one of the second electrode strips Y1 to Y8 selected by the second selector to selectively generate the electrons from the intersecting region(s) therebetween.

Fifth Embodiment

Figure 19:
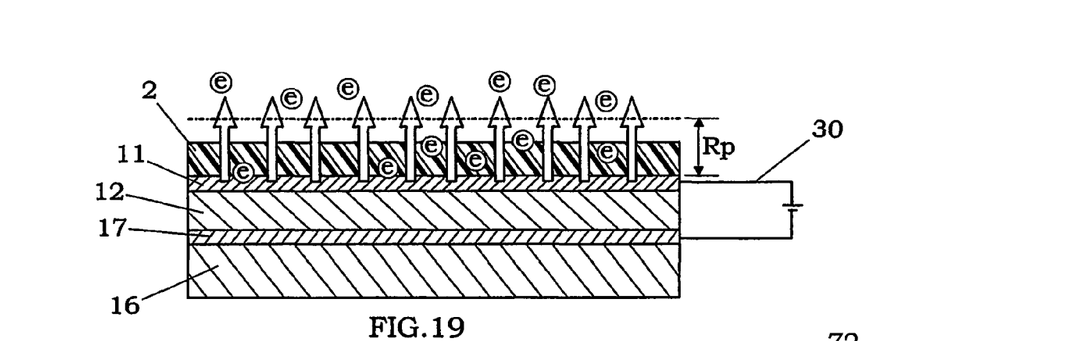
FIG. 19 is a schematic cross-sectional view showing a method of modifying an object with electrons according to a fifth embodiment of the present invention.

This embodiment explains about a modifying treatment performed under a condition that an object 2 directly contacts an electron emitting portion 10 of the cold cathode electron emitter 1. As shown in FIG. 19, the object 2 is directly placed on an electron emitting surface of the cold cathode electron emitter, and then electrons are irradiated to the object by the cold cathode electron emitter. In this case, as compared with a case that the object is spaced from the cold cathode electron emitter by a required distance, it is possible to minimize interference between the electrons emitted from the cold cathode electron emitter and atoms or molecules existing in the space therebetween. As a result, variations in energy distribution of electrons irradiated to the object can be reduced to uniformly perform the modifying treatment.

In addition, it is preferable that the entire object 2 is positioned in an electron penetrating region Rp, which is defined over a distance in a normal direction to the electron emitting surface of the cold cathode electron emitter 1. The distance is determined such that the electrons emitted from the cold cathode electron emitter 1 can pass through the object 2 placed in the electron penetrating region Rp. For example, when the object is a liquid or solid, it is preferred that the distance is smaller than 1 mm. In addition, when the object is a gas, it is preferred that the distance is smaller than 10 cm. As described below, this method is useful to activate the inside as well as the surface of the object by the irradiation of electrons.

Figure 20:
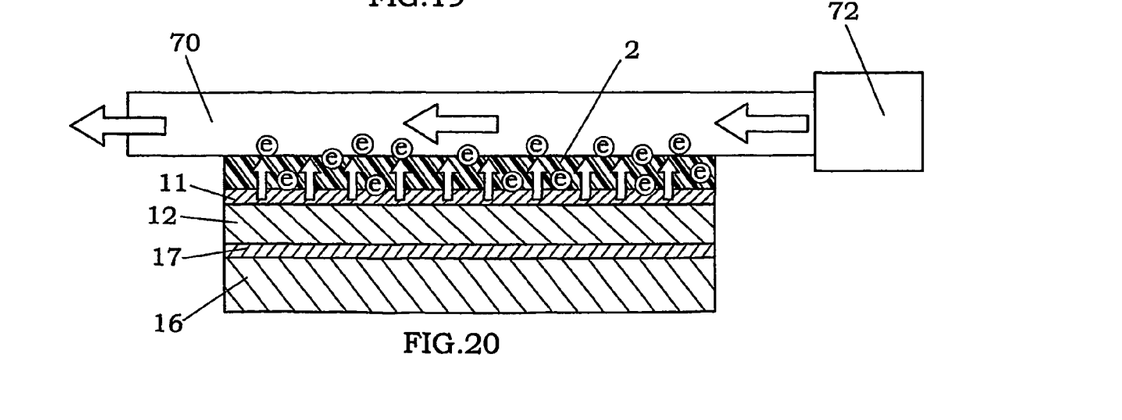
FIG. 20 is a schematic cross-sectional view showing a modifying treatment according to a modification of the fifth embodiment.

As shown in FIG. 20, the object 2 made of a catalyst material is disposed on the cold cathode electron emitter 1 such that a bottom surface of the object directly contacts the electron emitting surface thereof. On the other hand, the top surface of the object is exposed to a gas flow channel 70. Electrons are emitted to the object 2 by cold cathode electron emitter 1 to activate the catalyst material. When a polluted gas such as exhaust gas is supplied into the gas flow channel 70 by a gas supply unit 72, it is cleaned by the activated catalyst material. This method can be also utilized to generate hydrogen from methanol or methane. In place of the catalyst material, a biomaterial, or a polymer membrane may be used as the object 2.

In the above embodiments, a Metal-Insulator-Metal (MIM) electron emitter or a Metal-Insulator-Semiconductor (MIS) electron emitter may be used as the cold cathode electron emitter in place of the Ballistic electron Surface-emitting Device (BSD).

In addition, the apparatus explained in each of the above embodiments can be regarded as the minimum unit in the case of constructing a high performance modifying apparatus, which has the capability of providing a further improved treatment efficiency. For example, such a high performance apparatus can be obtained by forming a two- or three-dimensional array of a plurality of modifying apparatuses, each of which is substantially the same as the apparatus of any one of the above embodiments, such that object is exposed to larger amounts of electrons provided from different directions.

In addition, the modifying apparatus according to any one of the above embodiments may comprise a sensor for detecting the presence or absence of the object in the treatment space, and a switching device(s) for applying the voltage between the first and second electrodes and if necessary between the accelerating electrode and the first electrode in accordance with an output of this sensor. Moreover, the switching device(s) may be operated according to the output of another sensor for detecting information such as amounts or the number of the object(s), posture or position of the object, or the kind of the object. Furthermore, the modifying apparatus may comprise means for controlling parameters such as irradiation amount, irradiation time, and irradiation angle as well as the energy level of electrons, thereby improving the modifying effect and saving power consumption

EXAMPLES

Some examples of demonstrating modifying effects achieved by use of the modifying apparatuses described above of the present invention are introduced below.

Example 1

In this Example, the modifying apparatus shown in FIG. 10 was used. By applying 15 V to the cold cathode electron emitter 1, and 100 V to the accelerating electrode 50, while supplying oxygen gas into the case 20 through the gas inlet 22 under atmospheric pressure, negative ions of oxygen were ejected outside through the opening 21 without the occurrence of ozone. By use of the generated negative ions of oxygen, a refreshing effect to the human body and a propagation of good bacteria such as yeast and acidophilus were confirmed. This effect can be also utilized to propagate a Bacterium coli carrying a useful gene in biological and medical fields.

Example 2

In this Example, the modifying apparatus shown in FIG. 11 was used. By applying 15 V to the cold cathode electron emitter 1, 100 V to the accelerating electrode 50, and 300 V between the auxiliary electrodes (55, 56), while supplying oxygen gas into the case 20 through the gas inlet 22 under atmospheric pressure, negative ions of oxygen were ejected outside through the opening 21 without the occurrence of ozone. In this case, amounts of the generated negative ions were larger than the amounts generated in Example 1. By use of the generated negative ions of oxygen, a refreshing effect to the human body and a further increase in propagation of good bacteria were confirmed.

Example 3

In this Example, the modifying apparatus shown in FIG. 15 was used. By applying 15 V to the cold cathode electron emitter 1, 500 V to the accelerating electrode 50, and 300 V to the auxiliary electrode 55, while supplying a dry air into the case 20 through the gas inlet 22, and flowing a gas including steam provided from the gas supply unit 72 in the gas flow channel 70 under atmospheric pressure, negative ions of oxygen and minus ion clusters each having an aggregation of water molecules with a diameter of 10 to 20 nm as a nucleus were ejected without the occurrence of ozone from a gas outlet the gas flow channel 70 provided at the side opposed to the gas supply unit 72. By use of the generated negative ions of oxygen and the minus ion clusters, antifungal action, antibacterial action, and inactivation of pollen were confirmed. In addition, the indoor air was deodorized and cleaned.

Example 4

In this Example, the modifying apparatus shown in FIG. 13 was used. By applying 15 V to the cold cathode electron emitter 1, 1000 V to the accelerating electrode 50, and 300 V to the auxiliary electrode 55, while supplying a dry air into the case 20 through the gas inlet 22 under atmospheric pressure, electrons were irradiated to an agar medium carrying Bacterium coli thereon as the object 2 through the opening 21. As compared with the case of not irradiating electrons, amounts of colonies of Bacterium coli were remarkably decreased by the irradiation of electrons. Thus, a high bactericidal effect was confirmed.

INDUSTRIAL APPLICABILITY

From understood from the above embodiments, according to the present invention, it is possible to uniformly and efficiently perform various kinds of modifying treatments depending on the energy level of electrons irradiated to the object even when the object is in a liquid or gas state other than the solid state, or an organism. In addition, by using the cold cathode electron emitter comprising the pair of electrodes, and the strong field drift layer including nanocrystalline silicon disposed between the electrodes, i.e., the Ballistic electron Surface-emitting Device (BSD), the modifying treatments can be performed under atmospheric pressure.

Therefore, the modifying apparatus and method of the present invention are expected to be used in a large variety of application areas such as smoke neutralizer, air conditioner, humidifier, dehumidifier, cloth drier, dish drier, lavatory drier, fan heater, cleaner, refrigerator, closet, kitchen cabinet, shoe cupboard, bath room, laundry machine, freezer, ice maker, and sterilizer.

The invention claimed is:

1. A method of modifying an object with electrons comprising the steps of:
   electrons from a planar electron emitting portion of a cold-cathode electron emitter according to a tunnel effect;
   applying a voltage to said emitter to emit the electrons from said planar electron emitting portion; and
   exposing the object to the electrons,
   wherein said emitter comprises a pair of first and second electrodes, and a strong field drift layer disposed between the first and second electrodes,
   wherein the strong field includes columnar polycrystalline silicon grains extending toward the first electrode, first silicon oxide thin films formed in surfaces of the silicon grains, fine grains of nanocrystalline silicon formed between the adjacent silicon grains, and second silicon oxide thin films formed in surfaces of the fine grains, and
   wherein the electrons are emitted from said planar electron emitting portion by applying the voltage between the first and second electrodes.

2. The method as set forth in claim 1, wherein the object is exposed to the electrons under a pressure substantially equal to atmospheric pressure.

3. The method as set forth in claim 1, comprising the steps of accelerating the electrons emitted from said emitter to irradiate the accelerated electrons to the object.

4. The method as set forth in claim 1, wherein an energy of the electrons is in a range of 1 eV to 50 keV.

5. The method as set forth in claim 4, wherein the energy of the electrons is in a range of 1 eV to 100 eV.

6. The method as set forth in claim 1, wherein a space between said emitter and said object is filled with a dry gas.

7. The method as set forth in claim 6, wherein said dry gas includes at least one of oxygen and nitrogen.

8. The method as set forth in claim 1, wherein a gas having a smaller electron affinity than oxygen is filled in a space between said emitter and said object.

9. The method as set forth in claim 1, wherein said object is placed to directly contact said planar electron emitting portion of said emitter.

10. An apparatus for modifying an object with electrons comprising:
   a cold-cathode electron emitter, which has the capability of emitting electrons from a planar electron emitting portion according to tunnel effect;
   voltage applying means for applying a voltage to said emitter to emit the electrons from said planar electron emitting portion; and
   a case for accommodating said emitter therein, said case having an opening, through which the electrons or a gas activated by the electrons are provided,
   wherein said cold-cathode electron emitter comprises a pair of first and second electrodes, and a strong field drift layer disposed between the first and second electrodes,
   wherein the strong field includes columnar polycrystalline silicon grains extending toward the first electrode, first silicon oxide thin films formed in surfaces of the silicon grains, fine grains of nanocrystalline silicon formed between the adjacent silicon grains, and second silicon oxide thin films formed in surfaces of the fine grains, and wherein said voltage applying means applies the voltage between the first and second electrodes to emit the electrons from said planar electron emitting portion.

11. The apparatus as set forth in claim 10, further comprising a holder for supporting the object at outside of said case such that the electrons are irradiated to the object through said opening.

12. The apparatus as set forth in claim 10, wherein said case has an intake port for supplying a gas as the object therein, so that said gas is activated in said case by the electrons, and then provided outside through said opening.

13. The apparatus as set forth in claim 10, further comprising an accelerating electrode for accelerating the electrons emitted from said emitter, which is positioned in face-to-face relation with said planar electron emitting portion.

14. The apparatus as set forth in claim 13, wherein said accelerating electrode is an anode electrode, and a gas supplied into a clearance between said case and said anode electrode is activated by the electrons provided through said opening.

15. The apparatus as set forth in claim 10, wherein the first electrode is composed of an array of first electrode strips, which are arranged to be spaced from each other in a lateral direction, and the second electrode is composed of an array of second electrode strips, which are arranged to be spaced from each other in a direction intersecting with said lateral direction, wherein the electrons are selectively emitted from said planar electron emitting portion corresponding to an intersecting region(s) between at least one of the first electrode strips and at least one of the second electrode strips when the voltage is applied therebetween by said voltage applying means.

16. The apparatus as set forth in claim 15 further comprising a first selector for selecting at least one of the first electrode strips, and a second selector for selecting at least one of the second electrode strips, wherein said voltage applying means applies the voltage between at least one of the first electrode strips selected by the first selector and at least one of the second electrode strips selected by the second selector to selectively emit the electrons from said planar electron emitting portion corresponding to the intersecting region(s) therebetween.

17. An apparatus for modifying an object with electrons comprising:

a cold-cathode electron emitter, which has the capability of emitting electrons from a planar electron emitting portion according to tunnel effect;

voltage applying means for applying a voltage to said emitter to emit the electrons from said planar electron emitting portion; and a case for accommodating said emitter therein, said case having an opening, through which the electrons or a gas activated by the electrons are provided, wherein said cold-cathode electron emitter comprises a pair of first and second electrodes, and a strong field drift layer disposed between the first and second electrodes, wherein the strong field includes columnar polycrystalline silicon grains extending toward the first electrode, first silicon oxide thin films formed in surfaces of the silicon grains, fine grains of nanocrystalline silicon formed between the adjacent silicon grains, and second silicon oxide thin films formed in surfaces of the fine grains, wherein said voltage applying means applies the voltage between the first and second electrodes to emit the electrons from said planar electron emitting portion, and wherein said cold-cathode electron emitter is provided with a pair of cold-cathode electron emitters disposed in said case such that the electrons are provided in opposite directions through a pair of openings formed in said case when the voltage is applied between the first electrodes and the second electrodes of said emitters by said voltage applying means.

* * * * *